United States Patent
Nguyen et al.

(10) Patent No.: US 9,564,479 B2
(45) Date of Patent: Feb. 7, 2017

(54) FLEXIBLE DISPLAY

(71) Applicant: SAMSUNG DISPLAY CO., LTD., Yongin-si, Gyeonggi-Do (KR)

(72) Inventors: Thanh Tien Nguyen, Seoul (KR); Min-Sung Kim, Hwaseong-si (KR); Eun Young Lee, Seoul (KR); Ki Ju Im, Suwon-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/857,111

(22) Filed: Sep. 17, 2015

(65) Prior Publication Data

US 2016/0247867 A1    Aug. 25, 2016

(30) Foreign Application Priority Data

Feb. 25, 2015  (KR) .................. 10-2015-0026806

(51) Int. Cl.
*H01L 27/32* (2006.01)
*H01L 51/00* (2006.01)
*H01L 29/423* (2006.01)

(52) U.S. Cl.
CPC ..... *H01L 27/3262* (2013.01); *H01L 29/42376* (2013.01); *H01L 29/42384* (2013.01); *H01L 51/0097* (2013.01); *H01L 2251/5338* (2013.01)

(58) Field of Classification Search
CPC ........... H01L 27/3262; H01L 29/42384; H01L 29/42376
See application file for complete search history.

(56) References Cited

U.S. PATENT DOCUMENTS

| | | |
|---|---|---|
| 8,237,165 B2 | 8/2012 | Kim et al. |
| 2006/0220015 A1* | 10/2006 | Rho ............. H01L 27/1214 257/59 |
| 2008/0164464 A1* | 7/2008 | Kato ............. H01L 27/283 257/40 |
| 2009/0032849 A1* | 2/2009 | Higashino ...... H01L 29/7827 257/262 |
| 2014/0166983 A1* | 6/2014 | Cohen ........... H01L 29/42392 257/29 |

(Continued)

FOREIGN PATENT DOCUMENTS

KR   10-2010-0130898 A   12/2010
KR   10-2011-0106539 A    9/2011

(Continued)

OTHER PUBLICATIONS

Amit Babel, et al. Electrospun Nanofibers of Blends of Conjugated Polymers: Morphology, Optical Properties, and Field-Effect Transistors, Macromolecules 2005, 38, pp. 4705-4711.

*Primary Examiner* — Joseph C Nicely
(74) *Attorney, Agent, or Firm* — Lee & Morse, P.C.

(57) ABSTRACT

A flexible display includes a driving circuit to drive a light emitting device. The driving circuit includes a thin film transistor which includes a column-shaped gate electrode extending in a first direction, a gate insulating layer enclosing an outer surface of the gate electrode, a semiconductor layer on an outer surface of the gate insulating layer, and first and second conductive layers enclosing first and second areas of the semiconductor layer, respectively.

18 Claims, 18 Drawing Sheets

(56) References Cited

U.S. PATENT DOCUMENTS

| | | | |
|---|---|---|---|
| 2014/0332859 A1* | 11/2014 | Colinge | H01L 29/42376 257/288 |
| 2015/0179722 A1* | 6/2015 | Koo | H01L 27/3258 257/40 |
| 2016/0064662 A1* | 3/2016 | Masuoka | H01L 45/06 257/4 |

FOREIGN PATENT DOCUMENTS

| | | |
|---|---|---|
| KR | 10-2012-0121747 A | 11/2012 |
| KR | 10-2013-0125715 A | 11/2013 |

\* cited by examiner

FLEXIBLE DISPLAY

CROSS-REFERENCE TO RELATED APPLICATION

Korean Patent Application No. 10-2015-0026806, filed on Feb. 25, 2015, and entitled, "Flexible Display," is incorporated by reference herein in its entirety.

BACKGROUND

1. Field

One or more embodiments described herein relate to a flexible display.

2. Description of the Related Art

An organic light emitting diode display generates images using a plurality of pixels. Each pixel includes an organic emission layer between a hole injection electrode and an electron injection electrode. Light is emitted based on a recombination of holes injected from an anode and electrons injected from a cathode in the organic emission layer. A display of this type has low power consumption, high luminance, and high reaction speed.

One type of organic light emitting diode display uses glass substrates. These substrates are heavy and fragile and thus make transporting the display inconvenient. Also, glass substrates have proven unsuitable for large screen displays.

Given these considerations, flexible organic light emitting diode displays have been developed. These displays use flexible substrates made of materials (e.g., plastic) that are lighter and more resistant to impact. Such a display may be folded or rolled and therefore may be easily carried and used in various applications. However, when a flexible organic light emitting diode display is excessively bent or repeatedly bent over time, various devices in the display (e.g., thin film transistors) may be damaged or conductive wirings may be disconnected.

SUMMARY

In accordance with one or more embodiments, a flexible display including a substrate; a light emitting device on a surface of the substrate; and a driving circuit to drive the light emitting device, the driving circuit including a thin film transistor on the surface of the substrate, the thin film transistor including: a column-shaped gate electrode extending in a first direction relative to the surface of the substrate; a gate insulating layer enclosing an outer surface of the gate electrode; a semiconductor layer on an outer surface of the gate insulating layer; and first and second conductive layers enclosing first and second areas of the semiconductor layer, respectively.

The semiconductor layer may have substantially a ring shape enclosing the outer layer of the gate insulating layer. The first and second conductive layers may have substantially a ring shape enclosing a portion of an outer circumferential surface of the gate insulating layer. The first and second areas may correspond to different ends of the semiconductor layer.

The second conductive layer may include a conductive layer which extends in an outer circumferential direction to contact the light emitting device. The first conductive layer or the second conductive layer may enclose a portion of the outer circumferential surface of the semiconductor layer. A channel of the thin film transistor may be on the surface of the substrate in the first direction.

In accordance with one or more other embodiments, a display panel includes a neutral area; and a transistor having a core-shell structure in the neutral area, wherein the neutral area is between first and second areas and wherein the neutral area to experience less strain than the first and second areas when the display panel is bent. The transistor may be symmetrical relative to an axis of the neutral area. The display panel may bend in first and second directions along the axis of the neutral area. The first and second directions may be opposing directions.

The axis of the neutral area may be substantially aligned with a central region of the transistor; and an outer surface of the transistor may overlap the first and second areas. The axis of the neutral area may be aligned with a semiconductor layer corresponding to a gate of the transistor. The display panel may include a light emitting circuit in the neutral area. The transistor and the light emitting circuit may be aligned along the axis of the neutral area.

The core-shell structure of transistor may have a substantially cylindrical shape. The display panel may include a first substrate; and a second substrate substantially parallel to the first substrate, wherein an axis passing through a gate electrode of the transistor crosses the first and second substrates. The transistor may have a gate electrode having a first diameter; a gate insulating layer having a second diameter; first and second conductive layers having a third diameter; and a semiconductor layer having a fourth diameter between the first and second conductive layers, wherein the first and second conductive layers correspond to source and drain electrodes of the transistor and wherein the first, second, third, and fourth diameters are measured relative to the axis of the neutral area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
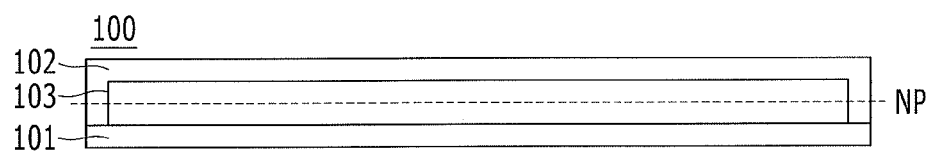
FIG. 1 illustrates an embodiment of a display panel of a flexible display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it may be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. It will be understood that when an element such as a layer, film, region, or substrate is referred to as being "on" another element, it can be directly on the other element or intervening elements may also be present.

In accordance with at least one embodiment, a flexible display may be equally bent in both directions. To prevent cracks from occurring on an organic light emitting element layer and/or characteristics of a thin film transistor from deteriorating due to the repeated or excessive bending, the thin film transistor is formed to have a core-shell structure. Further, the thin film transistor and the organic light emitting element layer may be disposed on a neutral surface of a display panel.

Figure 2:
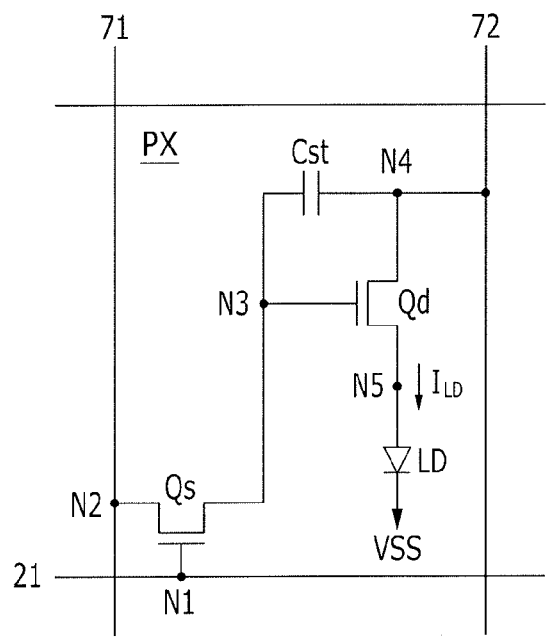
FIG. 2 illustrates an embodiment of a pixel.
Figure 3:
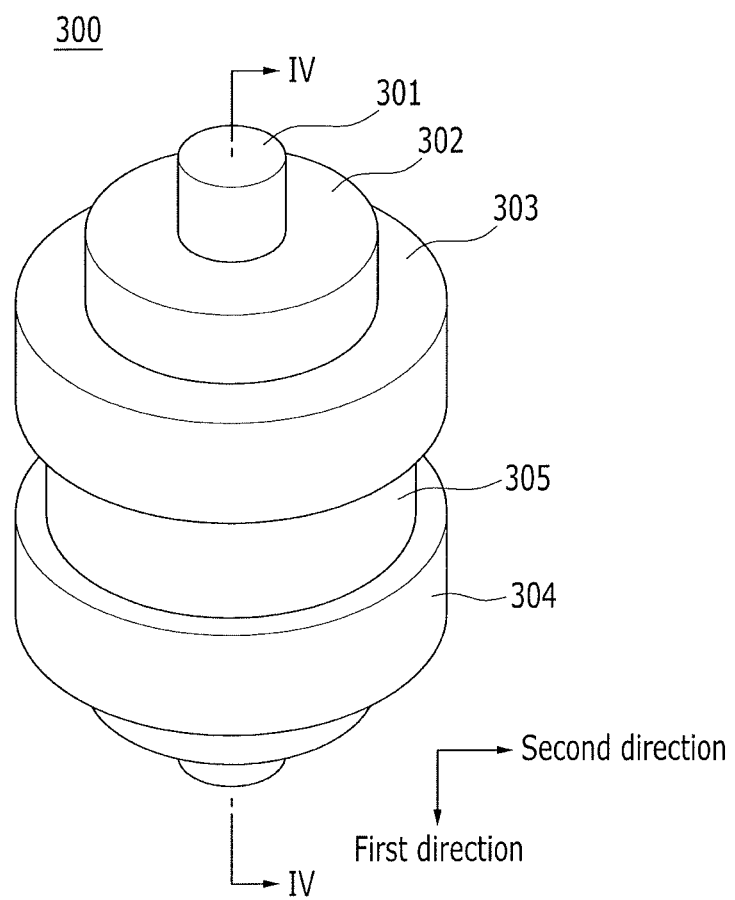
FIG. 3 illustrates an embodiment of a transistor in the pixel.
Figure 4:
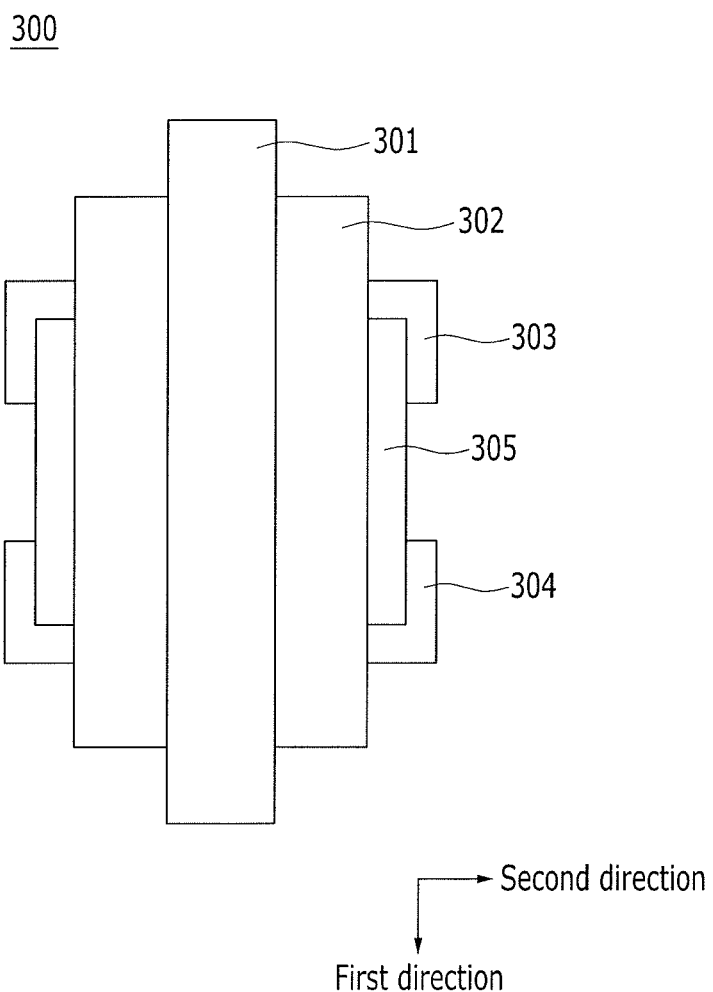
FIG. 4 illustrates a view of the transistor along section line IV-IV in FIG. 3.
Figure 5:
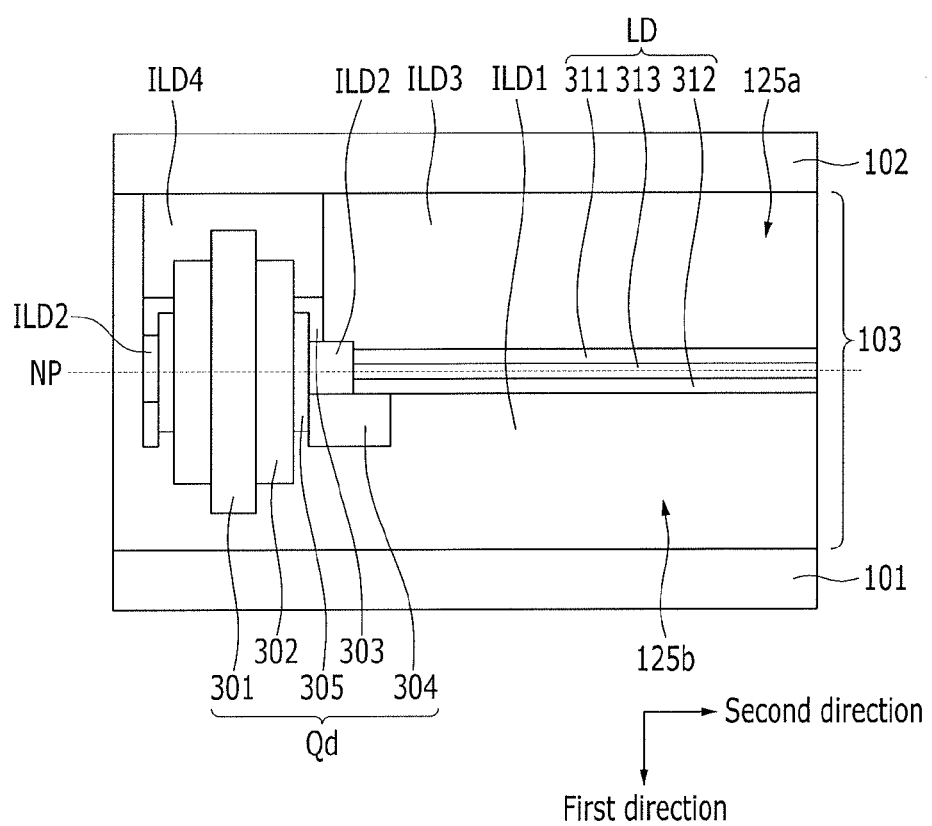
FIG. 5 illustrates a view of an embodiment of a device layer of the display panel.

FIG. 1 is a cross-sectional view of an embodiment of a display panel 100 of a flexible display. FIG. 2 is an equivalent circuit diagram of an embodiment of a pixel, which, for example, may be included in the flexible display. FIG. 3 is a perspective view of an embodiment of a thin film transistor, which, for example, may be included in the pixel(s) of the flexible display. FIG. 4 is a cross-sectional view of the thin film transistor of FIG. 3 taken along the line IV-IV. FIG. 5 is an enlarged cross-sectional view of a device layer of the display panel of FIG. 1.

Referring to FIG. 1, the display panel 100 includes a device layer 103 between first and second substrates 101 and 102. The first and second substrates 101 and 102 serve to protect the device layer 103.

The first and second substrates 101 and 102 form a flexible substrate. The first substrate 101 is a base substrate and is made of one or more flexible materials, e.g., a plastic. The second substrate 102 encapsulates the device layer 103 from the outside to protect the device layer 103. The second substrate 102 may be formed, for example, of an inorganic layer or the combination of an inorganic layer and an organic layer. The device layer 103 includes a light emitting device and a driving circuit unit which may configure each pixel of the display panel 100.

FIG. 2 illustrates an embodiment of a pixel PX which includes the light emitting device and the driving circuit. Referring to FIG. 2, the pixel PX is connected to a plurality of signal lines 21, 71, and 72. The pixel PX may be representative, for example, of a red pixel R, a green pixel G, or a blue pixel B in the display device.

The signal line 21 is a scanning signal line for transferring a gate signal or scanning signal. The signal line 71 is a data line for transferring a data signal. The signal line 72 is a driving voltage line for transferring, for example, a driving voltage. The scanning signal lines 21 extend in approximately a row direction and are approximately parallel with each other. The data lines 71 extend in approximately a column direction D2 and are approximately parallel with each other. FIG. 2 illustrates that the driving voltage lines 72 approximately extend in the column direction, but the driving voltage lines 72 may extend in the row direction D1 or the column direction D2 and/or may be formed in a net shape in another embodiment.

The pixel PX includes a switching transistor Qs, a driving transistor Qd, a storage capacitor Cst, and an organic light emitting element LD. The switching transistor Qs includes a control terminal N1 connected to the scanning signal line 21, an input terminal N2 connected to the data line 71, and an output terminal N3 connected to the driving transistor Qd. The switching transistor Qs transfers a data signal from the data line 71 to the driving transistor Qd based on a scanning signal from the scanning signal line 21.

The driving transistor Qd includes a control terminal N3 connected to the switching transistor Qs, an input terminal N4 connected to the driving voltage line 72, and an output terminal N5 connected to the organic light emitting element LD. The driving transistor Qd transfers an output current ILD having a magnitude that varies depending on the voltage applied between the control terminal N3 and the output terminal N5.

The storage capacitor Cst is connected between the control terminal N3 and the input terminal N4 of the driving transistor Qd. The storage capacitor Cst is charged with a data signal applied to the control terminal N3 of the driving transistor Qd when the switching transistor Qs is turned on. The storage capacitor Cst maintains the charged state even after the switching transistor Qs is turned off.

The organic light emitting element LD is an organic light emitting diode, which includes an anode connected to the output terminal N5 of the driving transistor Qd and a cathode connected to a common voltage Vss. The organic light emitting element LD emits light with an intensity that varies depending on the output current ILD of the driving transistor Qd. The organic light emitting element LD may include an organic material which uniquely emits any one or at least one of three primary colors of red, green, and blue. An image is generated based on light corresponding to a spatial sum of these colors as emitted from the pixels in the display.

The switching transistor Qs and the driving transistor Qd may be an n-channel or p-channel thin film transistors. When the switching transistor Qs and the driving transistor Qd are n-channel thin film transistors, a control terminal, an input terminal, and an output terminal of each of the switching transistor Qs and the driving transistor Qd may correspond to gate, drain and source electrodes. When the switching transistor Qs and the driving transistor Qd are p-channel thin film transistors, the control terminal, the input terminal, and the output terminal of each of the switching transistor Qs and the driving transistor Qd may correspond to the gate, drain and source electrodes.

In one embodiment, each pixel PX of the display panel 100 has a 2T-1C structure, e.g., two thin film transistors and one capacitor. Each pixel may have a different number of thin film transistors and/or capacitors in another embodiment. Also, a connection relationship among the switching and driving thin film transistors Qs and Qd, the storage capacitor Cst, and the organic light emitting element LD may be different in another embodiment.

During manufacture, the organic light emitting element LD and/or the thin film transistors Qs and Qd in the device layer 103 may be damaged (e.g., a crack may form) due to a stress that occurs when the flexible display is bent or deformed. To prevent this damage from occurring, the device layer 103 may be formed on a natural surface during manufacture of the display panel 100. Also, when the flexible display bends due to external force, a compression stress and/or a tension stress may occur in the display panel 100. However, a surface that does not change in length may be present at an intermediate portion of the display panel 100. This surface is called a neutral surface NP.

When stress is applied (e.g., tension stress or compression stress), the neutral surface NP is not substantially stretched or compressed. The neutral surface, therefore, may be considered to be an area in which strain is substantially zero, where strain represents a ratio of a changed length or a volume to an original length or volume. Here, the neutral surface NP is not substantially changed and therefore strain is substantially zero. Therefore, even when the flexible display is bent, the strain of the neutral surface NP of the display panel 100 is kept at zero. However, the size of the compression stress or tension stress (and thus the strain) may increase with increasing distance from the neutral surface NP.

When the thin film transistors Qs and Qd in each pixel are formed to have a laminar structure, even though the device layer 103 is disposed on the neutral surface NP, delamination may occur due to the deformation by the stress. Therefore, there is a limitation in even bending in both directions.

In one exemplary embodiment, to prevent delamination between or among components of the thin film transistor due to the bending of the flexible display and to allow the flexible display to be bent in opposing or different directions, the thin film transistors Qs and Qd in pixel PX are formed to have a core-shell structure, e.g., one having a cylinder shape which is in a vertical orientation relative to the substrates 101 and 102. The transistor(s) having the core-shell structure may be aligned with an axis that corresponds, for example, to the neutral surface (or area) NP of the display panel 100 where strain is less than adjacent other areas (see, e.g., FIG. 5).

FIGS. 3 and 4 illustrate an embodiment of a thin film transistor 300 having a core-shell structure with a cylinder shape. This transistor may be used to implement one or more transistors in each of the pixels of the display panel.

Referring to FIGS. 3 and 4, the thin film transistor 300 has a gate electrode 301 prepared in a cylindrical shape (or cylinder shape) extending in a first direction vertical to the substrates 101 and 102. The gate electrode 301 may include a metal or a conductive polymer material.

A gate insulating layer 302 is formed on an outer circumferential surface of the gate electrode 301, to enclose the outer circumferential surface of the gate electrode 301. The gate insulating layer 302 includes one or more insulating materials, e.g., silicon oxide, silicon nitride, or an organic material such as polyimide.

The thin film transistor 300 includes first and second conductive layers 303 and 304 and a semiconductor layer 305 on the outer circumferential surface of the gate insulating layer 302. The semiconductor layer 305 has a cylinder or ring shape which encloses a portion of the outer circumferential surface of the gate insulating layer 302. The semiconductor layer 305 is between the first and second conductive layers 305 and 304, and may include an organic material having conductive polymer or semiconductor properties.

The first and second conductive layers 303 and 304 have a cylinder or ring shape to enclose different areas of the gate insulating layer 302. The first and second conductive layers 303 and 304 are spaced from one another by a predetermined interval. For example, the first and second conductive layers 303 and 304 are symmetrical to each other relative to and contact different ends of the semiconductor layer 305. According to one exemplary embodiment, the first and second conductive layers 303 and 304 may enclose a portion of the outer circumferential surface of the semiconductor layer 305.

The first and second conductive layers 303 and 304 serve as source and drain electrodes (or drain and source electrodes). The first and second conductive layers 303 and 304 may be made of metal or a conductive polymer material. When the gate electrode 301 is applied with a predetermined electrical signal, a channel is formed in the semiconductor layer 305 to establish an electrical connection between the first and second conductive layers 303 and 304.

When the driving transistor Qd of the core-shell display panel 100 is formed in a cylindrical shape vertical to the substrates 101 and 102, unlike the existing laminar structure, the delamination phenomenon between components may be reduced or minimized. The thin film transistors Qs and/or Qd in each pixel PX of the display panel 100 may have the core-cell structure of the thin film transistor 30.

FIG. 5 illustrates an enlarged view of a portion of one embodiment of the device layer 103 in the display panel 100 of FIG. 1. The device layer 103 includes the driving transistor Qd having a core-shell structure. Additionally, or alternatively, the device layer may also include another thin film transistor (e.g., switching transistor Qs) with the same core-shell structure.

Referring to FIG. 5, the core-shell structure of the driving transistor Qd has a cylinder shape which is vertical to the substrates 101 and 102. The device layer 103 also includes the organic light emitting element layer LD as an organic light emitting element. The organic light emitting element layer LD has an organic emission layer 313 between first and second electrodes 311 and 312. The first and second electrodes 311 and 312 serve as a cathode and an anode, and the second electrode 312 is connected to the second conductive layer 304 of the driving transistor Qd.

The second conductive layer 304 of the driving transistor Qd may include a third conductive layer (e.g., 304a in FIG. 9) formed to extend in an outer circumferential direction to contact the second electrode 312 of organic light emitting element layer LD.

The driving transistor Qd and the organic light emitting element layer LD may be protected by an interlayer insulating structure and at least one insulating layer ILD1, ILD2, and ILD3 for planarization of the device layer 103.

In one exemplary embodiment, the semiconductor layer 305 of the driving transistor Qd (which is relatively vulnerable to the stress applied due to deformation of the display panel 100) and the organic light emitting element layer LD are disposed on a neutral surface NP (e.g., a neutral area) of the display panel 100. The neutral surface or area NP may be between adjacent areas 125a and 125b which experience greater strain than the strain experienced in the neutral area.

As illustrated in FIGS. 3 and 4, due to the structural characteristics of the thin film transistor having the core-shell structure (formed approximately symmetrically relative to the semiconductor layer 305), the semiconductor layer 305 is disposed on the neutral surface NP and thus the driving transistor Qd is formed to have a symmetrical structure relative the neutral surface NP. Therefore, the driving transistor Qd is uniformly applied with a stress regardless of the bending direction of the display panel 100. As a result, the driving transistor Qd may demonstrate uniform durability against bending in different (e.g., opposing) directions. In one exemplary embodiment, a photolithography process may be used to form the thin film transistor 300 having the core-shell structure of the display panel 100.

FIGS. 6A to 12B illustrate various stages of one embodiment of a method for manufacturing a display panel in a flexible display, which, for example, may be the display panel 100 of any of the aforementioned embodiments.

Figure 6A:
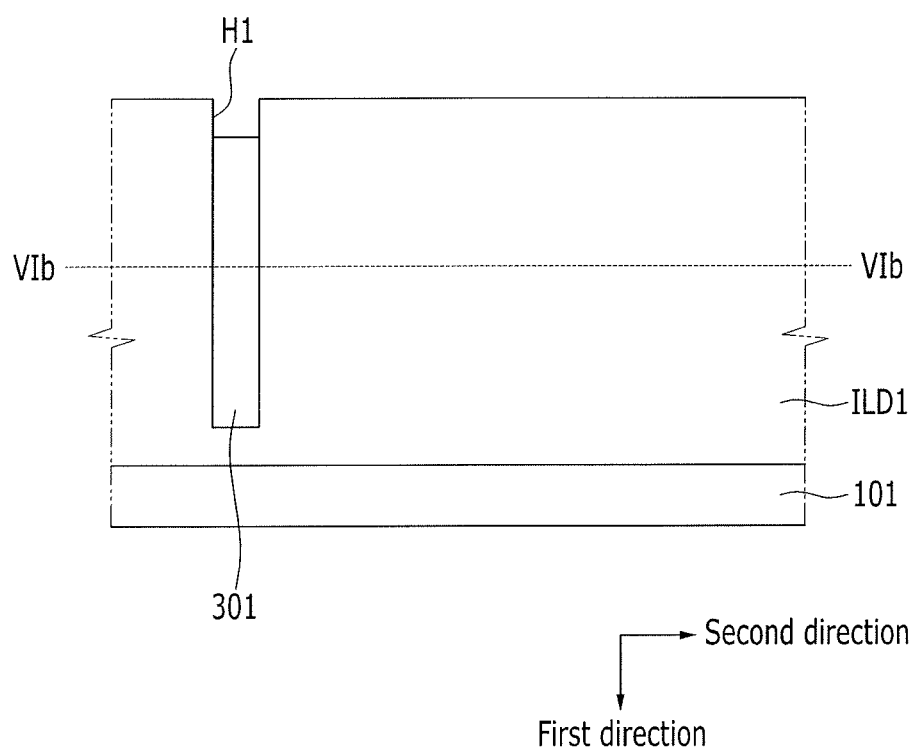
FIGS. 6A to 12B illustrate stages in one embodiment of a method for manufacturing a display panel of a flexible display device.
Figure 6B:
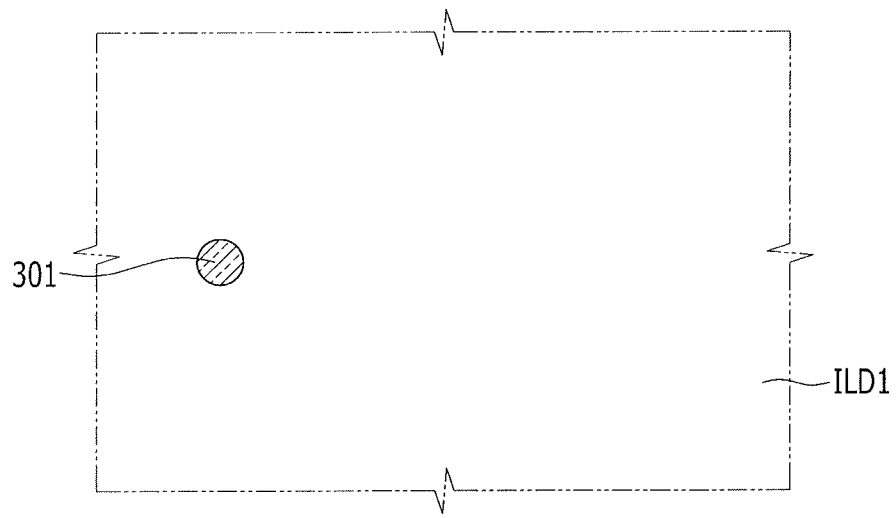

FIG. 6A illustrates a process of forming a gate electrode of a driving transistor for a pixel of the display panel, and FIG. 6B is a cross-sectional view of the display panel in the process of FIG. 6A along line VIb-VIb.

Figure 7A:
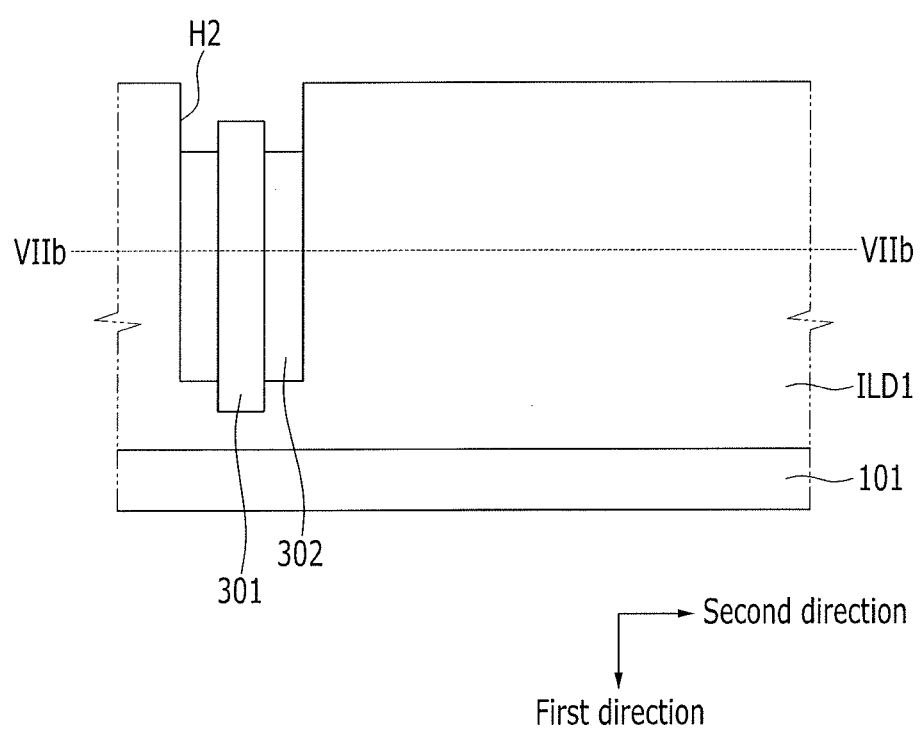
Figure 7B:
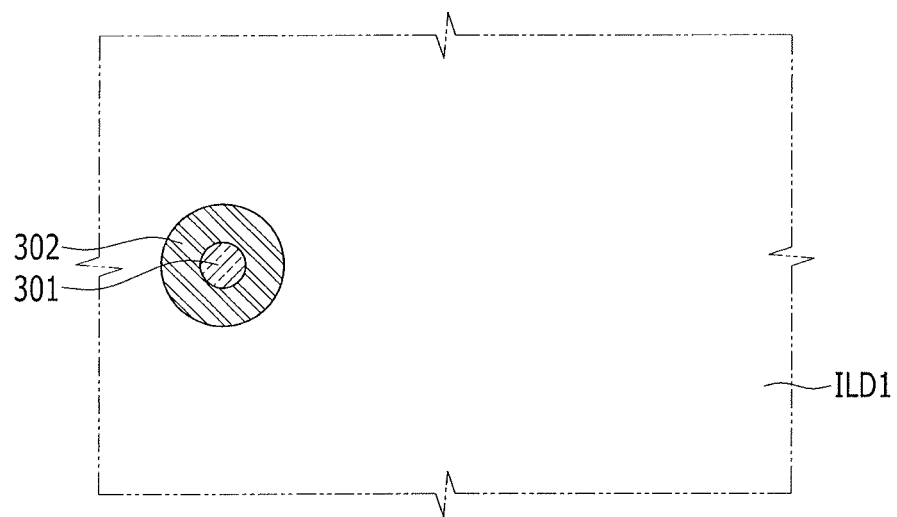

FIG. 7A illustrates a process of forming a gate insulating layer of a driving transistor of the pixel of the display panel, and FIG. 7B is a cross-sectional view of the display panel in the process of FIG. 7A along line VIIb-VIIb.

Figure 8A:
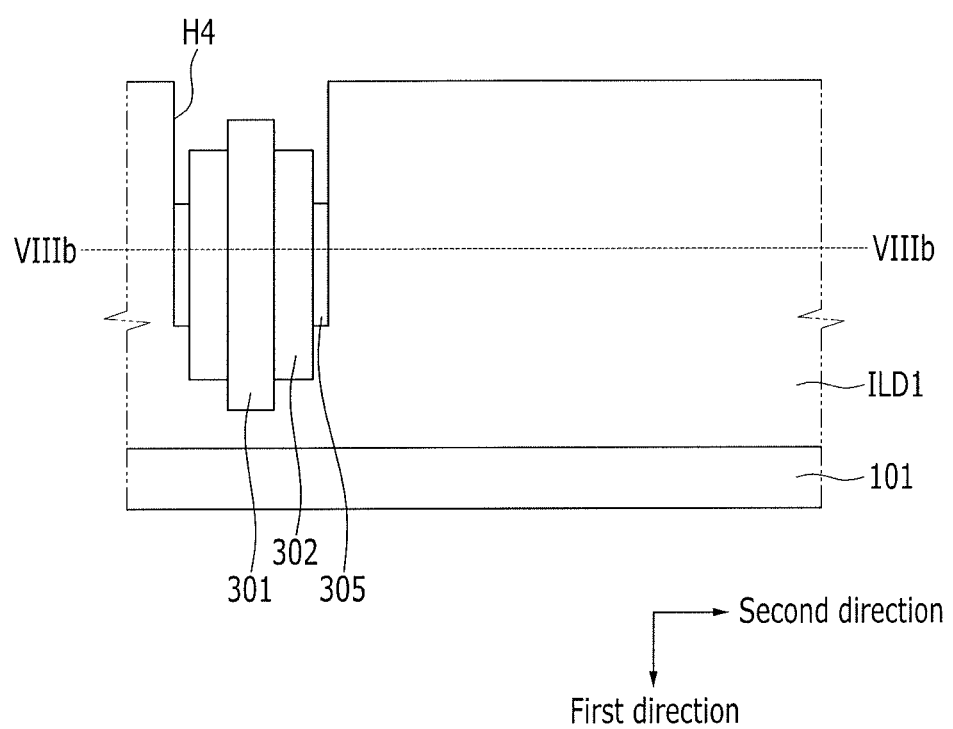
Figure 8B:
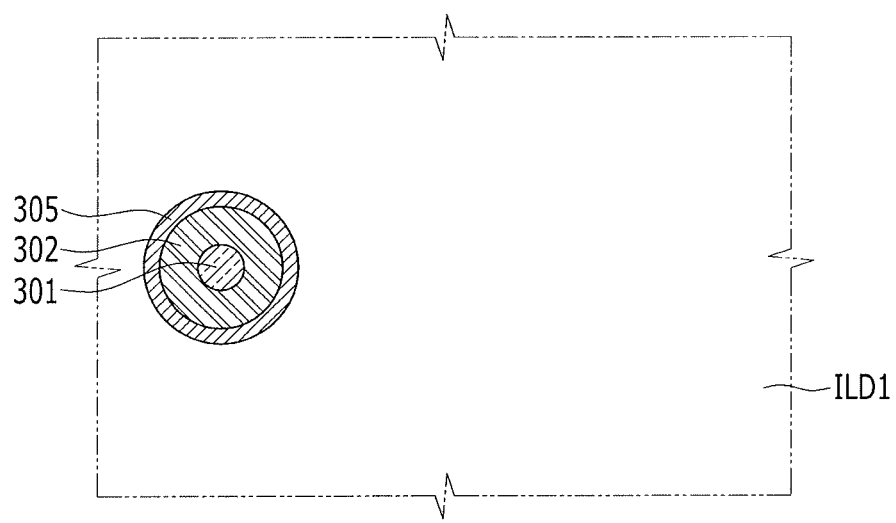

FIG. 8A illustrates a process of forming a semiconductor layer of a driving transistor of the pixel of the display panel, and FIG. 8B is a cross-sectional view of the display panel in the process of FIG. 8A along line VIIIb-VIIIb.

Figure 9A:
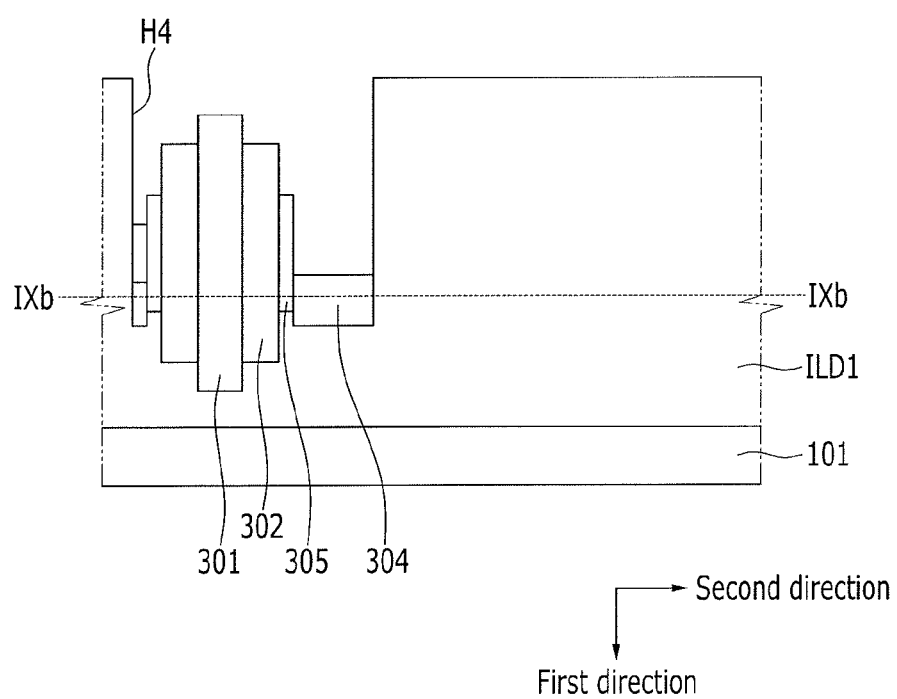
Figure 9B:
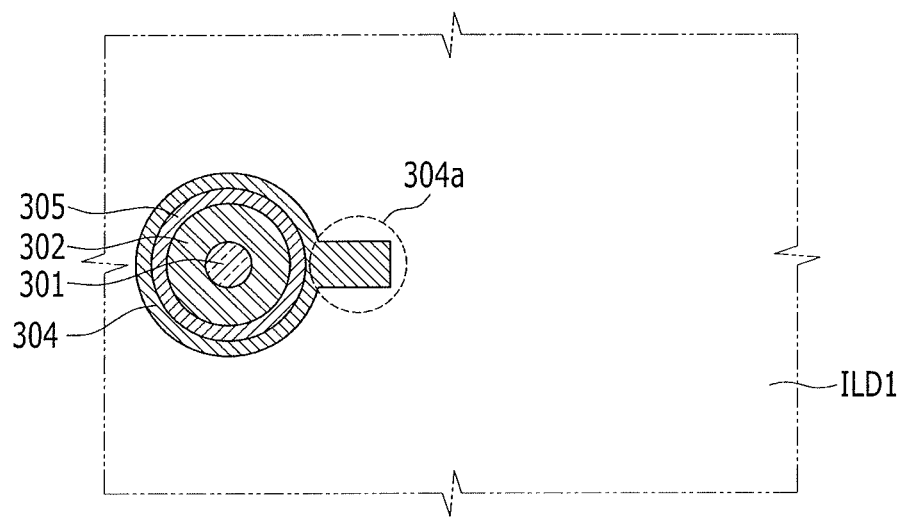

FIG. 9A illustrates a process of forming a second conductive layer of a driving transistor of the pixel of the display panel, and FIG. 9B is a cross-sectional view of the display panel in the process of FIG. 9A along line IXb-IXb.

Figure 10A:
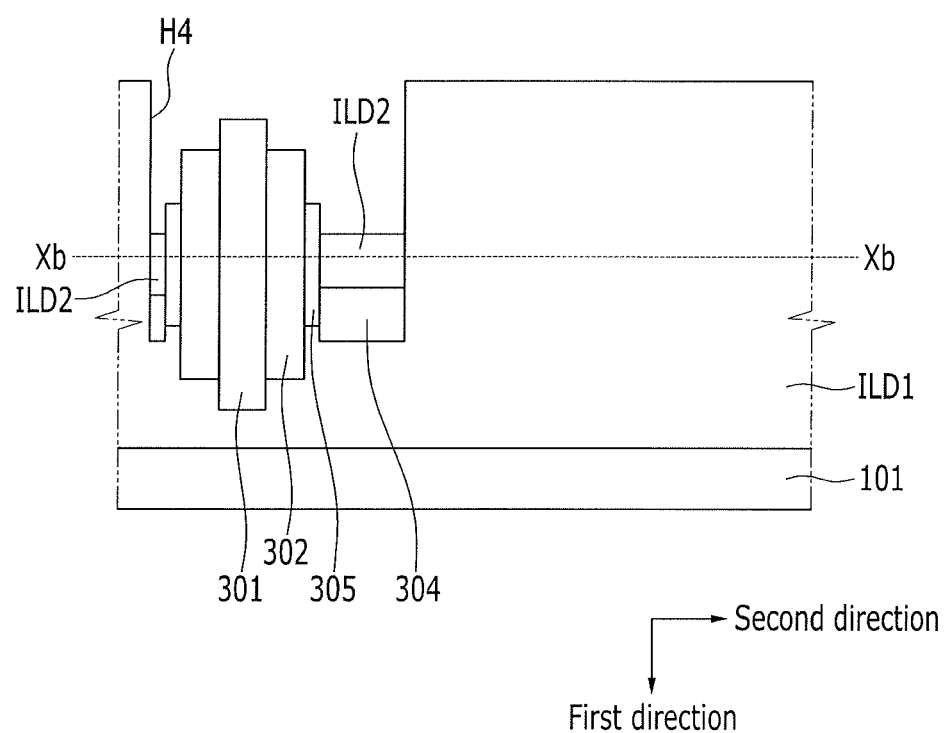
Figure 10B:
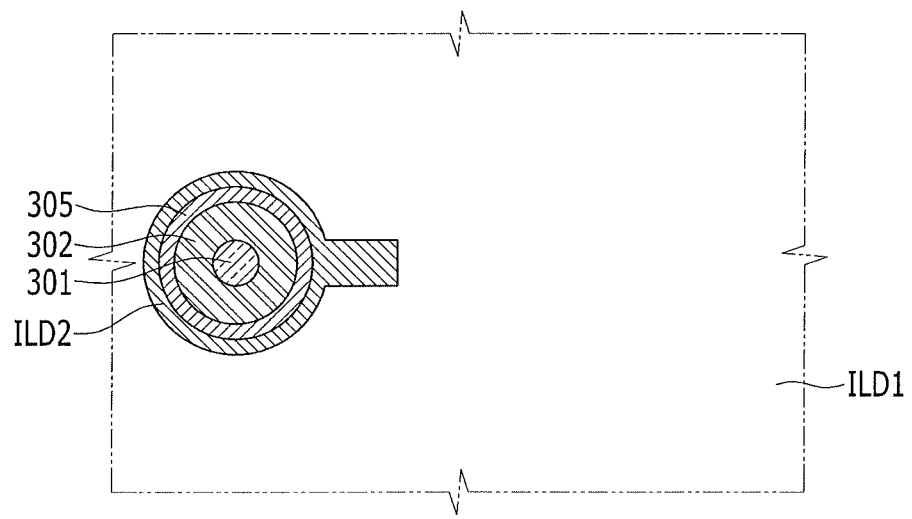
Figure 11A:
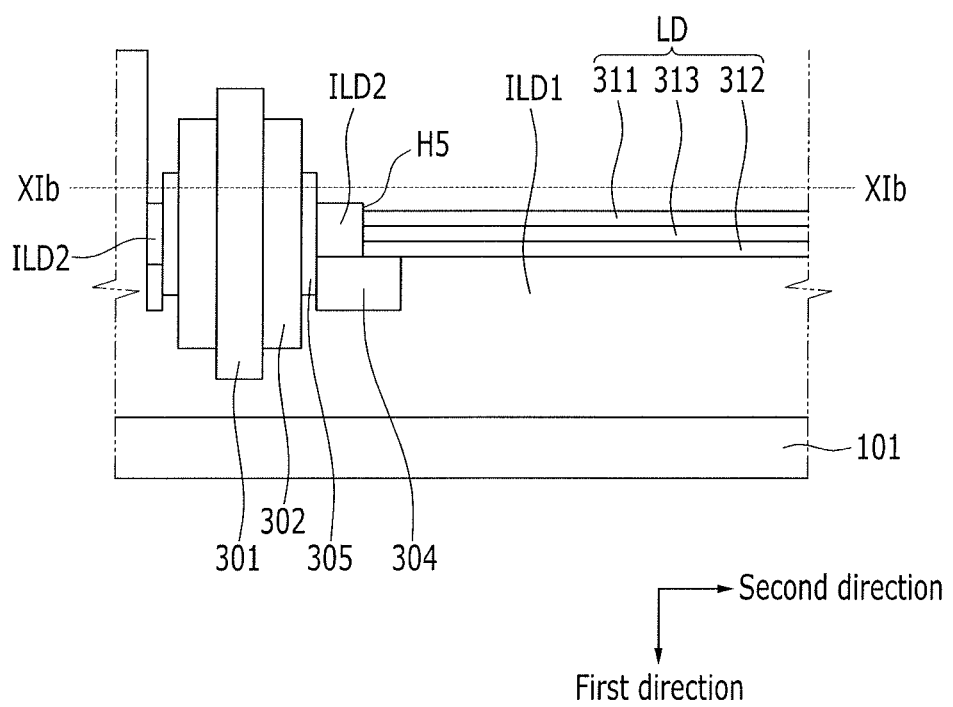
Figure 11B:
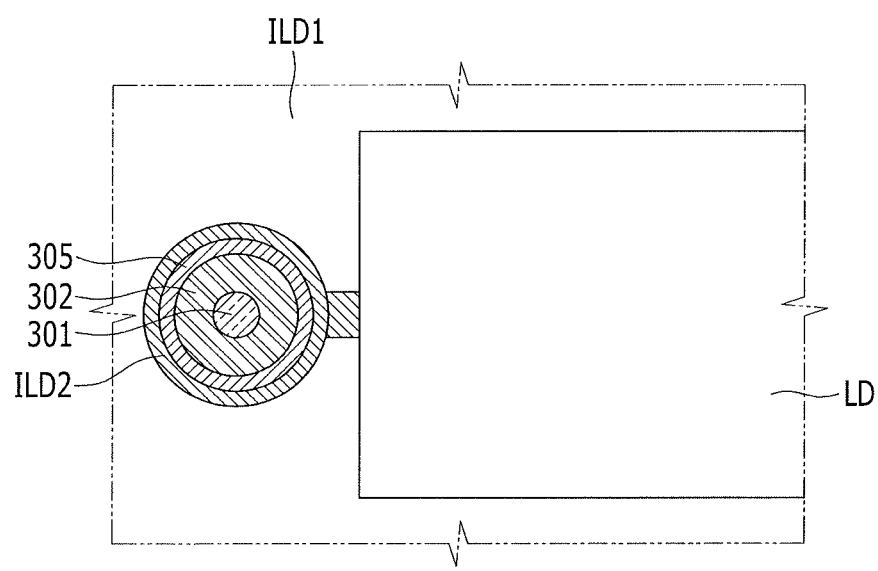

FIGS. 10A and 11A illustrates a process of forming organic light emitting element layer of the pixel of the display panel, and FIGS. 10B and 11B are cross-sectional views of the display panel in the process of FIGS. 10A and 11A along lines Xb-Xb and XIb-XIb.

Figure 12A:
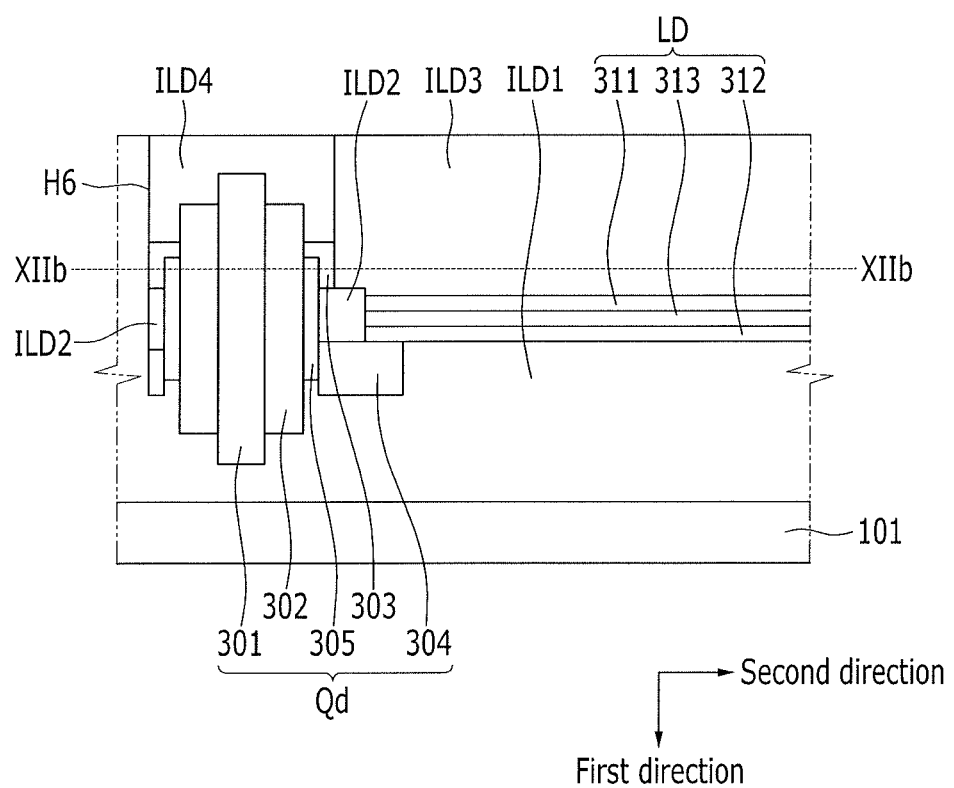
Figure 12B:
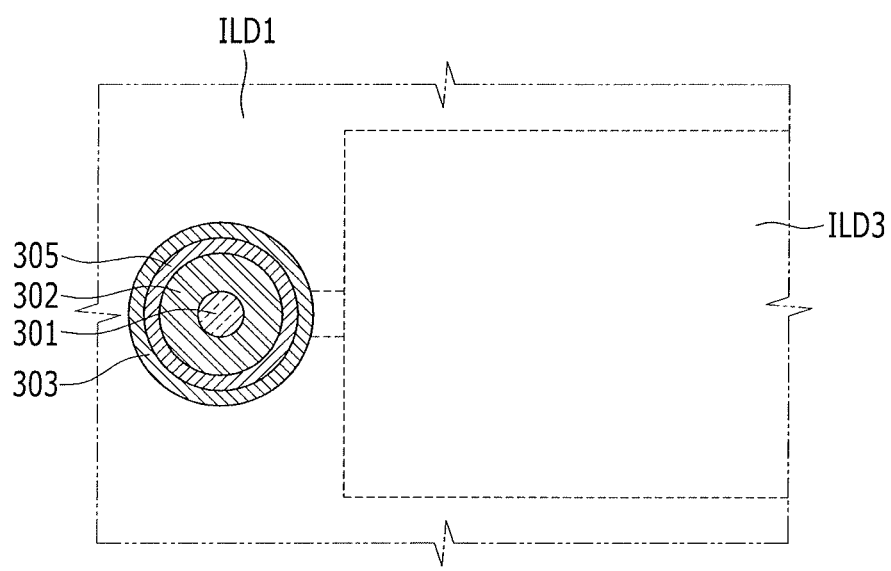

FIG. 12A illustrates a process of forming a first conductive layer of a driving transistor of the pixel of the display panel, and FIG. 12B is a cross-sectional view of the display panel in the process of FIG. 12A along line XIIb-XIIb.

Referring to FIGS. 6A and 6B, to manufacture the display panel 100, a first insulating layer ILD1 is formed on the substrate 101. Further, a first hole H1 for forming the gate electrode 310 of the driving transistor Qd is formed by removing a portion of the insulating layer ILD1 by the photo-lithography process. The first hole H1 may have an annular shape.

Next, a metal layer is formed by a deposition method to fill the first hole H1 and is then patterned to form the cylindrical gate electrode 301. In one exemplary embodiment, the gate electrode 301 may be formed by a lift off process which forms a photosensitive film pattern exposing the first hole H1 and then removes the metal layer.

Next, as illustrated in FIGS. 7A and 7B, a second hole H2, through which the outer circumferential surface of the gate electrode 301 is exposed, is formed by removing a portion of the insulating layer ILD1 by the photo-lithography process. The second hole H2 may be formed in an annular shape to enclose the gate electrode 301.

Next, the gate insulating layer 302 of the driving transistor Qd is formed by forming an insulating material by the deposition method to fill the second hole H2. The gate insulating layer 302 may have a cylinder (or ring) shape to enclose the outer circumferential surface of the gate electrode 301.

Next, as illustrated in FIGS. 8A and 8B, a third hole H3, through which the outer circumferential surface of the gate insulating layer 302 is partially exposed by removing a portion of the insulating layer ILD1, is formed by the photo-lithography process. The third hole H3 may be formed in an annular shape to enclose a portion of the outer circumferential surface of the gate insulating layer 302.

Next, the semiconductor layer 305 having the cylinder (or ring) shape enclosing a portion of the outer circumferential surface of the gate insulating layer 302 is formed by forming an organic material having conductive polymer or semiconductor properties by the deposition method to fill the third hole H3.

Next, as illustrated in FIGS. 9A and 9B, a fourth hole H4, through which the surface of the semiconductor layer 305 is exposed, is formed to form the first and second conductive layers 303 and 304 by removing a portion of the insulating layer ILD1 by the photo-lithography process. The fourth hole H4 may have an annular shape.

Next, the second conductive layer 304 having the cylinder (or ring) shape is formed by forming the metal layer and then patterning the metal layer by the deposition method to fill the fourth hole H4. The second conductive layer 304 is formed to enclose only a portion of the surface of the semiconductor layer 305. The second conductive layer 304 further includes a third conductive layer 304a which is formed to extend in an outer circumferential direction to contact the second electrode 312 of the organic light emitting element layer LD. In one exemplary embodiment, the second conductive layer 304 may be formed by the lift off process which forms the photosensitive film pattern exposing the fourth hole H4 and then the metal layer is removed.

Next, as illustrated in FIGS. 10A and 10B, the insulating layer ILD2 is formed by the deposition method to fill a portion of the fourth hole H4. The insulating layer ILD2 is to protect a surface which does not contact the first and second conductive layers 303 and 304 in the semiconductor layer 305, and may be the cylinder (or ring) which encloses a portion of the surface of the semiconductor layer 305. Further, the insulating layer ILD2 is to guide a position of the first conductive layer 303 and is formed on the second conductive layer 304 at a height corresponding to a spaced distance between the first and second conductive layers 303 and 304.

Next, as illustrated in FIGS. 11A and 11B, a fifth hole H5, which is an opening for forming the organic light emitting element layer LD, is formed by removing a portion of the insulating layers ILD1 and ILD2 by the photo-lithography process. An area of the second conductive layer 304 contacting the organic light emitting element layer LD is exposed by the fifth hole M5.

Next, the second electrode 312, the organic emission layer 313, and the first electrode 311 are sequentially formed in the opening H5 and thus the organic light emitting element layer LD is formed. A portion of the second electrode 312 of the organic light emitting element layer LD is formed to contact the second conductive layer 304 of the driving transistor Qd.

Next, as illustrated in FIGS. 12A and 12B, the insulating layer ILD3 for protecting the organic light emitting element layer LD is formed on the organic light emitting element layer LD. At the time of forming the insulating layer ILD3, the insulating layer ILD3 is formed in a remaining area other than a sixth hole H6 for forming the first conductive layer 303 of the driving transistor Qd. The sixth hole H6 may have an annular shape.

Next, the first conductive layer 303 having the cylinder (or ring) shape is formed by forming the metal layer and then patterning the metal layer by the deposition method to fill the sixth hole H6. The first conductive layer 303 is formed between the second conductive layer and the insulating layer ILD2 and is formed to contact a portion of the semiconductor layer 305. In one exemplary embodiment, the first conductive layer 303 may be formed by the lift off process which forms the photosensitive film pattern exposing the sixth hole H6 and then the metal layer is removed.

Next, the insulating layer ILD4 is formed by forming an insulating material filling the sixth hole H6 to protect the first conductive layer 303. The insulating layer ILD4 serves to protect the driving transistor Qd and planarize the device layer 103.

By way of summation and review, a flexible organic light emitting diode display may be folded or rolled and therefore may be easily carried and used in various applications. However, when a flexible organic light emitting diode display is excessively bent or repeatedly bent over time, various devices in the display (e.g., thin film transistors) may be damaged or conductive wirings may be disconnected.

In accordance with one or more of the aforementioned embodiments, the thin film transistor of one or more pixels in a flexible display is formed to have a core-shell structure aligned along a neutral surface of a display panel. The thin film transistor may be formed by a photolithography process used to form the device layer of the existing display panels. As a result, it is possible to manufacture the flexible display without requiring an specialized or additional facility for manufacturing the thin film transistor.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A flexible display, comprising:
   a substrate;
   a light emitting device on a surface of the substrate; and
   a driving circuit to drive the light emitting device, the driving circuit including a thin film transistor on the surface of the substrate, the thin film transistor including:
   a column-shaped gate electrode extending in a first direction relative to the surface of the substrate;
   a gate insulating layer enclosing an outer surface of the gate electrode;
   a semiconductor layer on an outer surface of the gate insulating layer; and
   first and second conductive layers enclosing first and second areas of the semiconductor layer, respectively.

2. The flexible display as claimed in claim 1, wherein the semiconductor layer has substantially a ring shape enclosing the outer layer of the gate insulating layer.

3. The flexible display as claimed in claim 2, wherein the first and second conductive layers have substantially a ring shape enclosing a portion of an outer circumferential surface of the gate insulating layer.

4. The flexible display as claimed in claim 3, wherein the first and second areas correspond to different ends of the semiconductor layer.

5. The flexible display as claimed in claim 4, wherein the second conductive layer includes a conductive layer which extends in an outer circumferential direction to contact the light emitting device.

6. The flexible display as claimed in claim 4, wherein the first conductive layer or the second conductive layer encloses a portion of the outer circumferential surface of the semiconductor layer.

7. The flexible display as claimed in claim 1, wherein a channel of the thin film transistor is on the surface of the substrate in the first direction.

8. A display panel, comprising:
   a neutral area; and
   a transistor having a core-shell structure in the neutral area, wherein a core of the core-shell structure includes a gate electrode,
   wherein the neutral area is between first and second areas and wherein the neutral area to experience less strain than the first and second areas when the display panel is bent.

9. The display panel as claimed in claim 8, wherein the transistor is symmetrical relative to an axis of the neutral area.

10. The display panel as claimed in claim 9, wherein the display panel bends in first and second directions along the axis of the neutral area.

11. The display panel as claimed in claim 10, wherein the first and second directions are opposing directions.

12. The display panel as claimed in claim 9, wherein:
    the axis of the neutral area is substantially aligned with a central region of the transistor; and
    an outer surface of the transistor overlaps the first and second areas.

13. The display panel as claimed in claim 12, wherein the axis of the neutral area is aligned with a semiconductor layer corresponding to a gate of the transistor.

14. The display panel as claimed in claim 8, further comprising:
    a light emitting circuit in the neutral area.

15. The display panel as claimed in claim 14, wherein the transistor and the light emitting circuit are aligned along an axis of the neutral area.

16. The display panel as claimed in claim 8, wherein the core-shell structure of transistor has a substantially cylindrical shape.

17. The display panel as claimed in claim 16, further comprising:
    a first substrate; and
    a second substrate substantially parallel to the first substrate,
    wherein an axis passing through a gate electrode of the transistor crosses the first and second substrates.

18. The display panel as claimed in claim 16, wherein the transistor has:
    a gate electrode having a first diameter;
    a gate insulating layer having a second diameter;
    first and second conductive layers having a third diameter; and
    a semiconductor layer having a fourth diameter between the first and second conductive layers, wherein the first and second conductive layers correspond to source and drain electrodes of the transistor and wherein the first, second, third, and fourth diameters are measured relative to the axis of the neutral area.

* * * * *